(12) United States Patent
Liu et al.

(10) Patent No.: US 10,279,391 B2
(45) Date of Patent: May 7, 2019

(54) MAGNETIC PHASE-TRANSFORMATION MATERIAL

(71) Applicant: Institute of Physics, Chinese Academy of Sciences, Beijing (CN)

(72) Inventors: Enke Liu, Beijing (CN); Zhiyang Wei, Beijing (CN); Wenhong Wang, Beijing (CN); Xuekui Xi, Beijing (CN); Jinglan Chen, Beijing (CN); Guangheng Wu, Beijing (CN)

(73) Assignee: Institute of Physics, Chinese Academy of Sciences, Beijing (CN)

( * ) Notice: Subject to any disclaimer, the term of this patent is extended or adjusted under 35 U.S.C. 154(b) by 550 days.

(21) Appl. No.: 14/983,725

(22) Filed: Dec. 30, 2015

(65) Prior Publication Data

US 2016/0256923 A1 Sep. 8, 2016

(30) Foreign Application Priority Data

Mar. 3, 2015 (CN) .......................... 2015 1 0095068

(51) Int. Cl.
*B22D 27/04* (2006.01)
*B22D 21/00* (2006.01)
(Continued)

(52) U.S. Cl.
CPC ......... *B22D 27/045* (2013.01); *B22D 21/005* (2013.01); *B22D 25/06* (2013.01);
(Continued)

(58) Field of Classification Search
CPC .... B22D 27/045; B22D 21/005; B22D 25/06; C22C 1/023; C22C 19/03; C22C 30/00
(Continued)

(56) References Cited

U.S. PATENT DOCUMENTS

| 5,161,728 | A | * | 11/1992 | Li | ......................... | B22F 1/025 |
| | | | | | | 228/124.1 |
| 6,270,719 | B1 | * | 8/2001 | Fetcenko | .............. | C01B 3/0031 |
| | | | | | | 148/421 |
| 6,634,413 | B2 | * | 10/2003 | Ray | ........................ | B22D 13/00 |
| | | | | | | 148/555 |
| 8,016,952 | B2 | * | 9/2011 | Ishida | ..................... | C22C 19/03 |
| | | | | | | 148/312 |

(Continued)

FOREIGN PATENT DOCUMENTS

JP 2001-279357 * 10/2001 ............. C22C 19/03

OTHER PUBLICATIONS

Z. Y. Wei et al., "Realization of multifunctional shape-memory ferromagnets in all-d-metal Heusler phases." Applied Physics Letters 107, pp. 022406-1 to 022406-5. (Year: 2015).*

(Continued)

*Primary Examiner* — Patricia L. Hailey
(74) *Attorney, Agent, or Firm* — Nutter McClennen & Fish LLP; David J. Powsner (57) ABSTRACT

A magnetic phase-transformation material with the formula $Ni_{a-m}Mn_{b-n}Co_{m+n}Ti_c$ is provided, wherein a+b+c=100, 20<a≤90, 5≤b<50, 5≤c≤30, 0≤m≤a, 0≤n≤b, 0<m+n<a+b, and wherein, any one or combination of a, b, c, m, n represent an atomic percentage content. The magnetic phase-transformation material has properties of high toughness, high deformation rate, ferromagnetism and magnetic field-driven martensitic phase transformation, which can be widely used in various fields including high-strength and high-toughness actuators, temperature and/or magnetic sensitive elements, magnetic refrigeration devices and equipments, magnetic heat pump devices, magnetic memories, micro-electromechanical devices and systems, and thermomagnetic power generators or transducers.

19 Claims, 4 Drawing Sheets

(51) Int. Cl.
*B22D 25/06* (2006.01)
*C21D 1/84* (2006.01)
*C22C 1/02* (2006.01)
*C22C 19/03* (2006.01)
*C22C 30/00* (2006.01)
*C22F 1/10* (2006.01)
*C22F 1/16* (2006.01)
*H01F 1/03* (2006.01)
*H01L 41/20* (2006.01)

(52) U.S. Cl.
CPC .............. *C21D 1/84* (2013.01); *C22C 1/023* (2013.01); *C22C 19/03* (2013.01); *C22C 30/00* (2013.01); *C22F 1/10* (2013.01); *C22F 1/16* (2013.01); *H01F 1/0308* (2013.01); *H01L 41/20* (2013.01)

(58) Field of Classification Search
USPC ......... 148/101, 559, 669, 674–675; 420/439, 420/459
See application file for complete search history.

(56) References Cited

OTHER PUBLICATIONS

Z. Y. Wei et al., "Magnetostructural martensitic transformations with large volume changes and magneto-strains in all-d-metal Heusler alloys." Applied Physics Letters 109, pp. 071904-1 to 071904-5 (Year: 2016).*

Rafael Fayzullin et al., "Phase transformations and magnetocaloric effect in Ni—Mn—(Co)—In Heusler alloys." Physics Procedia, vol. 75, pp. 1259-1264. (Year: 2015).*

Itegbeyogene P. Ezekiel et al., "Structural and magnetocaloric effect studies of Ni43-xTixMn46Sn11 Heusler alloys." Journal of Alloys and Compounds 749, pp. 672-680. (Year: 2018).*

Hu, F.X., et al., Large magnetic entropy change in a Heusler alloy Ni(52.6)Mn(23.1)Ga(24.3) single crystal. Phys Rev B, vol. 64, pp. 132412-1 to 132412-4, 2001.

* cited by examiner

MAGNETIC PHASE-TRANSFORMATION MATERIAL

CROSS REFERENCE TO RELATED APPLICATIONS

This application claims the benefit of Chinese Application No. CN201510095068.7 filed Mar. 3, 2015, the disclosure of which is herein incorporated by reference in its entirety.

TECHNICAL FIELD

The present invention relates generally to a magnetic material. More particularly, it relates to a high toughness magnetic material with magnetic phase transformation and structural phase transformation.

BACKGROUND

A conventional shape memory alloy is of crystal structure (referred to as "parent phase" hereinafter) at a relatively high temperature, which can be spontaneously transformed into another crystal structure (generally referred to as "martensitic phase") at a relatively low temperature. A material is transformed from a parent phase into a martensitic phase when cooled from a high temperature to a low temperature, which is known as Martensitic Phase Transformation. Inversely, the material is transformed from a martensitic phase into a parent phase when heated from a low temperature to a high temperature, which is known as Inverse Martensitic Phase Transformation. Generally, start and end points of the martensitic phase transformation are respectively referred to as $M_s$ and $M_f$ points, and start and end points of the inverse martensitic phase transformation are respectively referred to as $A_s$ and $A_f$ points. If the difference between $M_s$ and $A_s$ is small, for example, from several degrees Celsius to scores over 100° C., such martensitic phase transformation of the material is called Thermo-Elastic Martensitic Phase-Transformation.

In general, a certain kind of alloy material is cooled from a determined shape in a parent phase until a martensitic phase transformation occurs, then changing its original shape artificially, and subsequently, such alloy material is heated up until transformed back to the parent phase, and if the shape of the alloy material is completely or partially changed into its original shape, this phenomenon is called Shape Memory Effect. Moreover, in the same temperature cycle as above, if the shape in the parent phase is deformed at the moment of the phase transformation caused by the cooling and deformed again at the moment of the inverse phase transformation caused by the subsequent heating, and partially or completely transformed back to its original shape in the parent phase, this phenomenon is called Two-Way Shape Memory Effect.

Shape memory alloys are widely applied in various "smart" usages, such as various drivers, temperature sensitive elements, medical devices and high elastic brackets, and so on.

Conventional shape memory alloys, such as NiTi, have no magnetism. Magnetic shape memory alloys, such as $Ni_2MnGa$, FePt, MnNiGe alloys and the like, possess new properties which the previous shape memory materials do not have, that is, the magnetic shape memory alloys not only have the shape memory property based on the martensitic phase transformation, but also the ferromagnetism. These materials are called magnetic shape memory alloys or magnetic phase-transformation materials, wherein the Heusler magnetic shape memory alloys, such as $Ni_2MnGa$, are most typical and the main feature of this kind of materials is that the martensitic structural phase transformation and the magnetic structural phase transformation simultaneously occur (i.e., coupling of the structural phase transformation and the magnetic phase transformation). Some of this kind of materials could have the property that its martensitic phase transformation can be driven by an additional artificial magnetic field through optimization in performance. That is, they have not only the property of phase transformation of a conventional shape memory material, i.e., the martensitic phase transformation being driven by a temperature variation (heat energy) or an external stress (mechanical energy), but also the property of magnetic field-driven martensitic phase transformation. Due to the new property of magnetic field controllable phase transformation, this kind of magnetic shape memory alloys have more varied controllability and more popular applications, comparing to the previous conventional shape memory alloys. This kind of magnetic shape memory alloys can not only be used in actuators, temperature sensitive elements and high elastic materials, but also extended to magnetic sensing, electric sensing, magnetic driving, and magnetic refrigeration, and so on.

However, there are many disadvantages in the previous magnetic phase-transformation materials. The greatest disadvantage thereof is that the optimal materials having magnetic phase-transformation effect have poor mechanical property, such as toughness and deformation rate, due to comprising main group elements such as Ga, Sn, and Ge. For example, the compressive strength of the Heusler magnetic phase-transformation materials is about 350 MPa, and their deformation rate and toughness are nearly zero. These problems hinder the application of the current magnetic phase transformation materials in the above various aspects.

Therefore, there is a need for new magnetic phase-transformation materials with better mechanical properties.

SUMMARY OF INVENTION

In various aspects, the invention provides a magnetic phase-transformation material with the formula $Ni_{a-m}Mn_{b-n}Co_{m+n}Ti_c$, wherein a+b+c=100, 20<a≤90, 5≤b<50, 5≤c≤30, 0≤m≤a, 0≤n≤b, 0<m+n<a+b, and any one or combination of a, b, c, m, n represent an atomic percentage content.

In some aspects, the invention provides a magnetic phase-transformation materials, e.g., as described above in which 28≤a−m≤57.

In some aspects, the invention provides a magnetic phase-transformation materials, e.g., as described above in which 13≤b−n≤37.

In some aspects, the invention provides a magnetic phase-transformation materials, e.g., as described above in which 5≤m+n≤16.

In some aspects, the invention provides a magnetic phase-transformation materials, e.g., as described above in which 8≤c≤26.

In some aspects, the invention provides a magnetic phase-transformation materials, e.g., as described above in which the magnetic phase-transformation materials of the present invention are single crystal or polycrystalline.

In various aspects, the invention provides a method of preparing the magnetic phase-transformation materials with the formula $Ni_{a-m}Mn_{b-n}Co_{m+n}Ti_c$, comprising:

weighing materials of Ni, Co, Mn, Ti in accordance with the formula; and preparing the magnetic phase-transformation materials from the materials by a Czochralski method or zone melting method or directional solidification method.

The magnetic phase-transformation materials of $Ni_{a-m}Mn_{b-n}Co_{m+n}Ti_c$ provided in some aspects of the present invention have the common properties of the conventional magnetic phase-transformation materials, e.g., the crystal structure of this kind of materials are capable of being transformed between the aforementioned parent phase and martensitic phase when applied with a temperature change (heat energy) or an external stress (mechanical energy) or a magnetic field. Particularly, such materials have better mechanical properties, and higher toughness and higher deformation rate than the previous Heusler magnetic shape memory alloys, which enables a great improvement for workability and usability of the materials, and a wider range of their applications.

The magnetic phase-transformation materials of $Ni_{a-m}Mn_{b-n}Co_{m+n}Ti_c$ provided in some aspects of the present invention have the properties of high toughness, high deformation rate, ferromagnetism and magnetic field-driven martensitic phase transformation. One or more of their fundamental physical parameters, such as compressive strengths, deformation rates, the respective permeability and saturation magnetization in the martensitic phase and the parent phase, martensitic phase transformation temperature and inverse martensitic phase transformation temperature, could be modified based on the change of the compositions of Ni, Co, Mn, and Ti, e.g., changing the values of a, b, c, m and n or modified according to the usages.

The magnetic phase-transformation materials of $Ni_{a-m}Mn_{b-n}Co_{m+n}Ti_c$ provided in some aspects of the present invention have good mechanical properties, such as high toughness and high deformation rate, in both of the parent phase and the martensitic phase.

The magnetic phase-transformation materials of $Ni_{a-m}Mn_{b-n}Co_{m+n}Ti_c$ provided in some aspects of the present invention have a high magnetization.

The magnetic phase-transformation materials of $Ni_{a-m}Mn_{b-n}Co_{m+n}Ti_c$ provided in some aspects of the present invention have the property of magnetic field-driven phase transformation; with the magnetic field-driven martensitic phase transformation and inverse martensitic phase transformation, the materials present the magnetostrain effect, the magnetoresistance effect and the property of magnetic field-induced entropy change (magnetocaloric effect). Therefore, the magnetic phase-transformation materials of $Ni_{a-m}Mn_{b-n}Co_{m+n}Ti_c$ with high toughness provided in the present invention have extensive applications, such as high-strength and high-toughness actuators, temperature and/or magnetic sensitive elements, magnetic refrigeration devices and equipments, magnetic heat pumps, magnetic memories, micro-electromechanical devices and systems, thermomagnetic power generators or transducers, and so on. The properties of the materials shown in the accompanying drawings and table of this patent application illustrate that all the materials of the present invention can be used in the above various applications.

BRIEF DESCRIPTION OF ACCOMPANYING DRAWINGS

Embodiments of the present invention will be explained in detail with reference to the accompanying drawings, wherein.

DESCRIPTION OF EMBODIMENTS

In the following parts, the present invention will be described in greater details with reference to the embodiments and the accompanying drawings. It should be understood that the specific embodiments described herein only intend to interpret the present invention, without making any limitation thereto.

In the following various embodiments, the present inventors have measured the isothermal magnetization curves, resistance-magnetic field curves, stress-strain curves, magnetization-temperature relation curves, magnetocaloric effect characteristic curves, megnetostrain curves, and powder XRD spectrums of the samples obtained, for illustrating the relevant properties of the materials of the present invention. For simplicity, however, results of only several of the samples are shown, and the other samples have similar results for corresponding properties.

The First Embodiment

A magnetic phase-transformation material of $Ni_{40}Mn_{30}Co_{14}Ti_{16}$ with high toughness is prepared in this embodiment, and the preparation method comprises:

Step 1: weighing 100 g in total for materials of Ni, Co, Mn, Ti with purity of 99.9% in accordance with the formula $Ni_{40}Mn_{30}Co_{14}Ti_{16}$;

Step 2: inputting the weighed materials into a magnetic levitation cold crucible, raising the temperature to 1280° C. for melting them with a radio frequency of 245 kHz and a power of 20 kW under the condition of Ar of 0.1Mpa as the shielding gas, and maintaining at 1280° C. for 30 min; and then cooling down to the room temperature to form a smelted ingot as a raw material for later use;

Step 3: growing single crystals of $Ni_{40}Mn_{30}Co_{14}Ti_{16}$ with the conventional Czochralski method, in which the ingot obtained in Step 2 is heated in the above magnetic levitation cold crucible to 1280° C. and maintained for 30 min, and small single crystals of $Ni_{40}Mn_{30}Co_{14}Ti_{16}$ with a size of 2 mm×2 mm×7 mm are cut from the smelted ingot obtained in Step 2 as seed crystals, the bottoms of the seed crystals are brought in contact with the liquid level of the melted raw material at a rotation speed of 30 rounds/min and then, the seed crystal rod is lifted at a uniform speed of 30 mm/h so as to lift up the solidified crystal, during which the temperature of the melted raw material is adjusted for enabling the diameter of the growing crystal to increase from 2 mm to 10 mm and then remained unchanged until a high-quality single crystals of $Ni_{40}Mn_{30}Co_{14}Ti_{16}$ with a diameter of 10 mm and a length of 100 mm is obtained;

Step 4: lifting the single crystal rods of $Ni_{40}Mn_{30}Co_{14}Ti_{16}$ obtained in Step 3 out of the surface of the melted raw material, cooling down slowly to the room temperature at a cooling rate of 10° C./min, and finally taking out of the crucible;

Step 5: heat-treating the sample obtained in Step 4 for 72 hours at 1000° C., cooling down to 500° C., and then heat-treating again for 48 hours, and subsequently cooling down at a cooling rate of 10° C./s to make the obtained sample of $Ni_{40}Mn_{30}Co_{14}Ti_{16}$ have higher component homogeneity and atomic ordering.

The aforementioned various properties of the obtained single crystals of $Ni_{40}Mn_{30}Co_{14}Ti_{16}$ are measured, the characteristic curves thereof are collected, and the corresponding parameters are computed.

Figure 1:
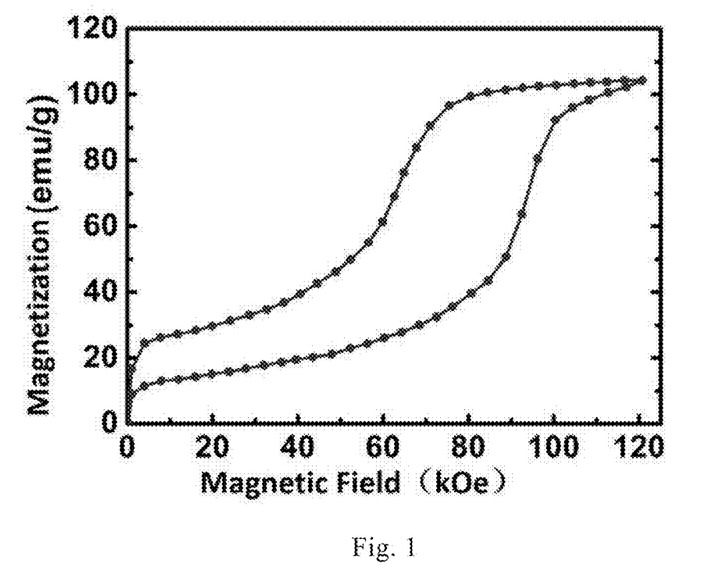
FIG. 1 shows the isothermal magnetization curve of a material of $Ni_{40}Mn_{30}Co_{14}Ti_{16}$ according to the first embodiment of the present invention.
Figure 2:
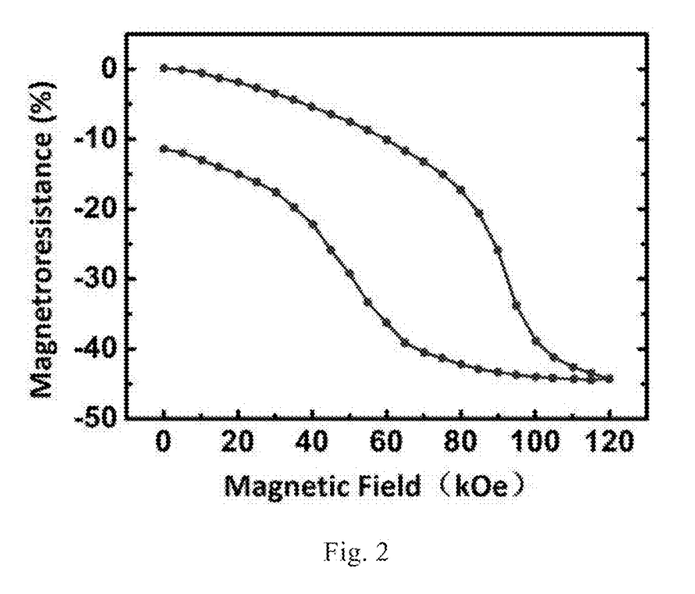
FIG. 2 shows the resistance-magnetic field curve of the material of $Ni_{40}Mn_{30}Co_{14}Ti_{16}$ according to the first embodiment of the present invention, as driven by a magnetic field.

The isothermal magnetization curve of $Ni_{40}Mn_{30}Co_{14}Ti_{16}$, as shown in FIG. 1, is obtained by using the Physical Property Measurement System (PPMS, Quantum Design Inc., US) at the temperature of 280K and under the normal pressure, which indicates the magnetism and the property of magnetic field-driven martensitic phase transformation of this material, and it can be seen that this material can be driven from the martensitic phase to the parent phase by applying a magnetic field. The resistance-magnetic field curve of $Ni_{40}Mn_{30}Co_{14}Ti_{16}$ driven by magnetic field, as shown in FIG. 2, is also obtained by using the Physical Property Measurement System at the temperature of 280K and under the normal pressure, which indicates the magnetoresistance property of this material, and it can be seen that the resistance of this material may have a change of 45% under the magnetic field. Table 1 shows the corresponding values of compressive strength, deformation rate, toughness, magnetic field driving efficiency (dT/dH), magnetostrain ($\lambda$), magnetoresistance (MR) and magnetic entropy change ($\Delta S$) of the material of $Ni_{40}Mn_{30}Co_{14}Ti_{16}$.

The Second Embodiment

A magnetic phase-transformation material of $Ni_{44}Mn_{33}Co_{15}Ti_8$ with high toughness is prepared in this embodiment, and the preparation method comprises:

Step 1: weighing 200 g in total for materials of Ni, Co, Mn, Ti with purity of 99.9% in accordance with the formula $Ni_{44}Mn_{33}Co_{15}Ti_8$;

Step 2: inputting the weighed materials into a quartz crucible, raising the temperature to 1300° C. with a radio frequency of 245 kHz and a power of 20 kW under the condition of Ar of 0.01Mpa as the shielding gas, and maintaining at 1300° C. for 20 min; and then cooling down to the room temperature to form a smelted ingot as the raw material for later use.

Step 3: growing magnetic crystal of $Ni_{44}Mn_{33}Co_{15}Ti_8$ with the conventional zone melting method, in which the ingot obtained in Step 2 is heated in the above quartz crucible to 1300° C. and maintained for 20 min, and single crystals of $Ni_{44}Mn_{33}Co_{15}Ti_8$ with [111] orientation and with a size of 2 mm×2 mm×7 mm are cut from the smelted ingot obtained in Step 2 as seed crystals, and then the seed crystals are arranged at one end of a quartz boat, and the melted raw material and the heating zone are made to move with respect to each other at a speed of 10 mm/h to form a solidified single crystals, obtaining a single crystal of $Ni_{44}Mn_{33}Co_{15}Ti_8$ with a width of 20 mm and a length of 50 mm;

Step 4: cooling down the single crystals of $Ni_{44}Mn_{33}Co_{15}Ti_8$ obtained in Step 3 slowly to the room temperature at a cooling rate of 10° C./min;

Step 5: annealing the sample obtained in Step 4 for 20 hours at 1000° C., and then cooling at a cooling rate of 100° C./s to make the obtained material of $Ni_{44}Mn_{33}Co_{15}Ti_8$ have higher component homogeneity and atomic ordering.

The aforementioned various properties of the obtained single crystals of $Ni_{44}Mn_{33}Co_{15}Ti_8$ are measured and the characteristic curves thereof are collected, and the corresponding parameters are computed. Table 1 shows the values of compressive strength, deformation rate, toughness, magnetic field driving efficiency (dT/dH), magnetostrain ($\lambda$), magnetoresistance (MR) and magnetic entropy change ($\Delta S$) of the material of $Ni_{44}Mn_{33}Co_{15}Ti_8$.

The Third Embodiment

A magnetic phase-transformation material of $Ni_{51}Mn_{13}Co_{10}Ti_{26}$ with high toughness is prepared in this embodiment, and the preparation method comprises:

Step 1: weighing 260 g in total for materials of Ni, Co, Mn, Ti with purity of 99.9% in accordance with the formula $Ni_{51}Mn_{13}Co_{10}Ti_{26}$;

Step 2: inputting the weighed materials into a quartz crucible with a diameter of 20 mm, raising the temperature to 1330° C. for melting them with a radio frequency of 245 kHz and a power of 25 kW under the condition of $N_2$ as the shielding gas with a positive pressure of 0.2 MPa, and maintaining at 1330° C. for 10 min.

Step 3: obtaining a polycrystalline orientation material of $Ni_{51}Mn_{13}Co_{10}Ti_{26}$ with a diameter of 20 mm and a length of 100 mm at a growing speed of 30 mm/h by the conventional directional solidification method;

Step 4: cooling down the polycrystalline of $Ni_{51}Mn_{13}Co_{10}Ti_{26}$ obtained in Step 3 slowly to the room temperature at a cooling rate of 10° C./min;

Step 5: annealing the sample obtained in Step 4 for 5 hours at 1200° C., and then cooling at a cooling rate of 20° C./min to make the obtained material of $Ni_{51}Mn_{13}Co_{10}Ti_{26}$ have higher component homogeneity and atomic ordering.

The aforementioned various properties of the obtained material of $Ni_{51}Mn_{13}Co_{10}Ti_{26}$ are measured and the characteristic curves thereof are collected, and the corresponding parameters are computed. Table 1 shows the values of compressive strength, deformation rate, toughness, magnetic field driving efficiency (dT/dH), magnetostrain ($\lambda$), magnetoresistance (MR) and magnetic entropy change ($\Delta S$) of the material of $Ni_{51}Mn_{13}Co_{10}Ti_{26}$.

The Fourth Embodiment

A magnetic phase-transformation material of $Ni_{45}Mn_{31}Co_5Ti_{19}$ with high toughness is prepared in this embodiment by the directional solidification method adopted in the third embodiment, and the differences of both embodiments lie in that: the raw materials weigh 1200 g in total in accordance with the formula; the quartz crucible has a diameter of 30 mm, and $N_2$ is used as the shielding gas under a positive pressure of 0.8 Mpa; the raw materials are heated to 1380° C. at a power of 40 kW and maintained at 1380° C. for 30 min; the growing speed is 10 mm/h, and the obtained material is annealed for 100 hours at 800° C., and then cooled at a cooling rate of 10000° C./s; and thus, a polycrystalline orientation material of $Ni_{45}Mn_{31}Co_5Ti_{19}$ with a diameter of 30 mm and a length of 200 mm is obtained;

The aforementioned various properties of the obtained material of $Ni_{45}Mn_{31}Co_5Ti_{19}$ are measured and the characteristic curves thereof are collected, and the corresponding parameters are computed. Table 1 shows the values of compressive strength, deformation rate, toughness, magnetic field driving efficiency (dT/dH), magnetostrain (λ), magnetoresistance (MR) and magnetic entropy change (ΔS) of the material of $Ni_{45}Mn_{31}Co_5Ti_{19}$.

The Fifth Embodiment

A magnetic phase-transformation material of $Ni_{49.5}Mn_{24}Co_{15.5}Ti_{11}$ with high toughness is prepared in this embodiment by the same method as that of the third embodiment except that the growing speed is 5 mm/h.

The obtained material of $Ni_{49.5}Mn_{24}Co_{15.5}Ti_{11}$ is heated to 500° C. and rolled down into a profile with a width of 50 mm and a height of 5 mm, and the length of the profile is not limited. The aforementioned various properties are measured and the characteristic curves thereof are collected for the profile, and the corresponding parameters are computed. Table 1 shows the values of compressive strength, deformation rate, toughness, magnetic field driving efficiency (dT/dH), magnetostrain (λ), magnetoresistance (MR) and magnetic entropy change (ΔS) of the profile of $Ni_{49.5}Mn_{24}Co_{15.5}Ti_{11}$.

The Sixth Embodiment

A magnetic phase-transformation material of $Ni_{36.5}Mn_{35}Co_{13.5}Ti_{15}$ with high toughness is prepared in this embodiment by the same method as that of the fourth embodiment except that the growing speed is 15 mm/h.

Figure 3:
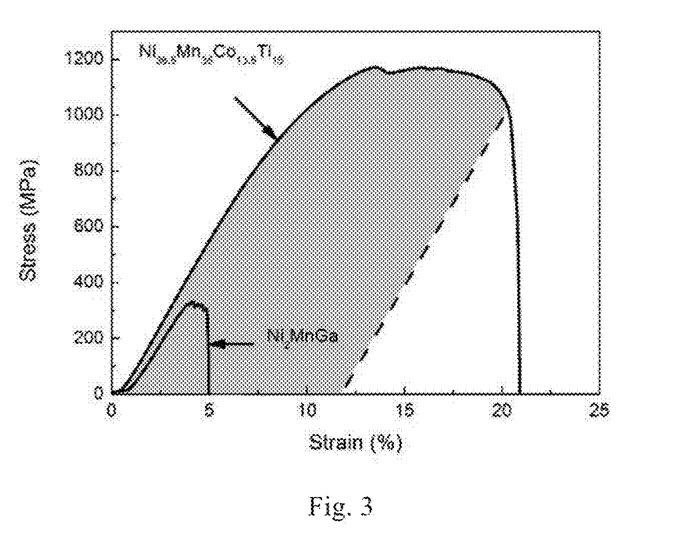
FIG. 3 shows the stress-strain curve of a material of $Ni_{36.5}Mn_{35}Co_{13.5}Ti_{15}$ according to the sixth embodiment of the present invention, and that of a material of $Ni_2MnGa$ according to Comparative Example 1.
Figure 4:
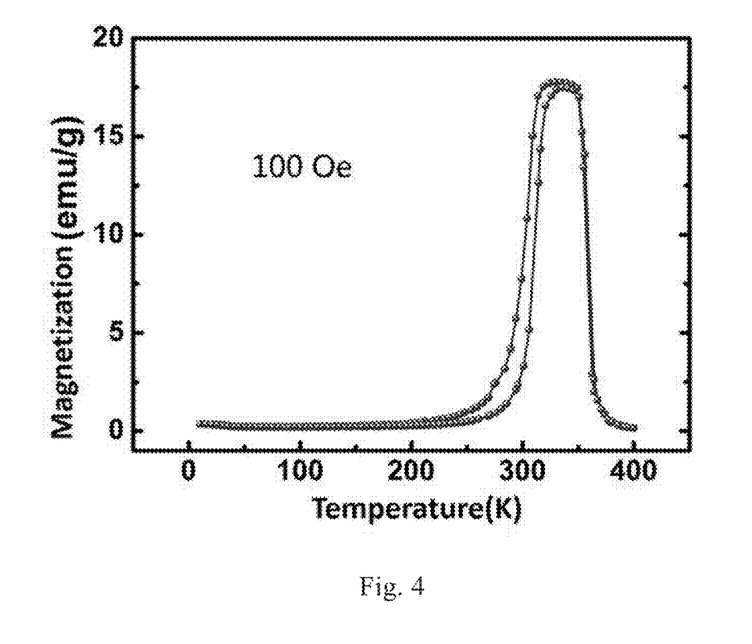
FIG. 4 shows the magnetization-temperature relation curve of the material of $Ni_{36.5}Mn_{35}Co_{13.5}Ti_{15}$ according to the sixth embodiment of the present invention.

The obtained material of $Ni_{36.5}Mn_{35}Co_{13.5}Ti_{15}$ is rolled down into a sheet of profile with a length of 2000 mm, a width of 300 mm and a thickness of 1 mm. The aforementioned various properties are measured and the characteristic curves thereof are collected for the profile, and the corresponding parameters are computed. The stress-strain curve of the material of $Ni_{36.5}Mn_{35}Co_{13.5}Ti_{15}$, as shown in FIG. 3, is obtained by the common stress-strain measuring equipment at the room temperature, which indicates the toughness and deformation rate of the material with the shadow area representing the value of toughness. The magnetism-temperature relation curve of the material of $Ni_{36.5}Mn_{35}Co_{13.5}Ti_{15}$, as shown in FIG. 4, is obtained by the SQUID magnetometer of Quantum Design. Inc., US, which indicates the property of martensitic phase-transformation of the material. Table 1 shows the values of compressive strength, deformation rate, toughness, magnetic field driving efficiency (dT/dH), magnetostrain (λ), magnetoresistance (MR) and magnetic entropy change (ΔS) of the profile of $Ni_{36.5}Mn_{35}Co_{13.5}Ti_{15}$.

The Seventh Embodiment

A magnetic phase-transformation material of $Ni_{35}Mn_{35}Co_{15}Ti_{15}$ with high toughness is prepared in this embodiment by the same method as that of the fourth embodiment except that the growing speed is 20 mm/h.

Figure 5:
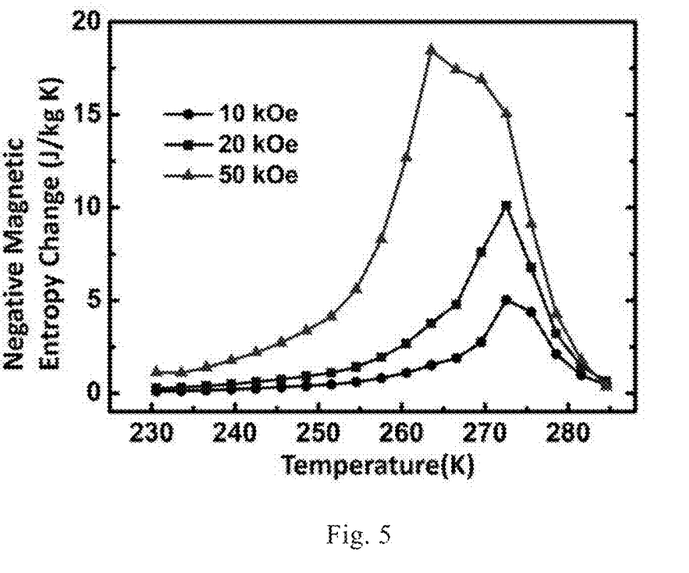
FIG. 5 shows the magnetocaloric effect characteristic curve of a material of $Ni_{35}Mn_{35}Co_{15}Ti_{15}$ according to the seventh embodiment of the present invention.

The obtained material of $Ni_{35}Mn_{35}Co_{15}Ti_{15}$ is rolled down into a sheet of profile with a length of 1000 mm, a width of 150 mm and a thickness of 3 mm at the temperature of 650° C. The aforementioned various properties are measured and the characteristic curves thereof are collected for this profile, and the corresponding parameters are computed. The magnetocaloric effect characteristic curve of the material of $Ni_{35}Mn_{35}Co_{15}Ti_{15}$, as shown in FIG. 5, is obtained by the Physical Property Measurement System (PPMS, Quantum Design. Inc., US), which indicates the magnetocaloric effect of such material. Table 1 shows the values of compressive strength, deformation rate, toughness, magnetic field driving efficiency (dT/dH), magnetostrain (λ), magnetoresistance (MR) and magnetic entropy change (ΔS) of the material of $Ni_{35}Mn_{35}Co_{15}Ti_{15}$.

The Eighth Embodiment

A magnetic phase-transformation material of $Ni_{57}Mn_{14}Co_{16}Ti_{13}$ with high toughness is prepared in this embodiment by the same method as that of the first embodiment except that: the materials weigh 200 g in total in accordance with the formula; the crucible is quartz crucible; the seed crystal rotation speed is 20 rounds/min; and the growing speed is 30 mm/h.

Figure 6:
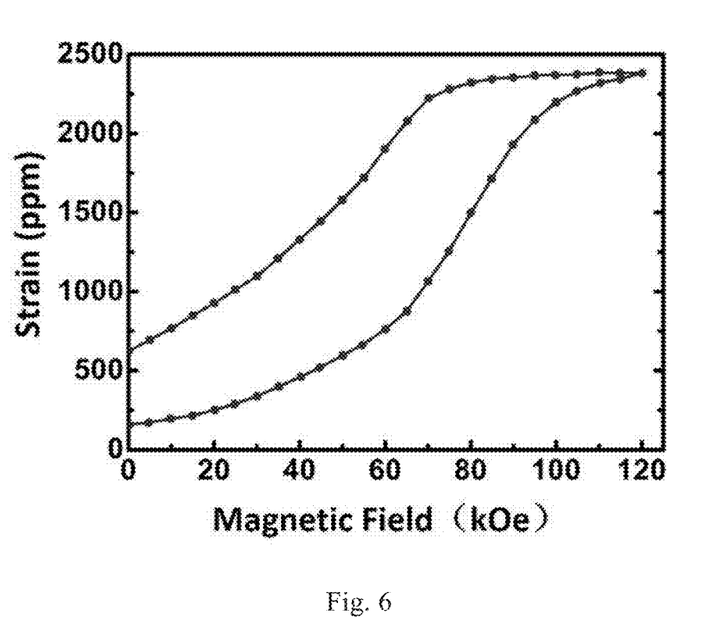
FIG. 6 shows the megnetostrain characteristic curve of a material of $Ni_{57}Mn_{14}Co_{16}Ti_{13}$ according to the eighth embodiment of the present invention.

The aforementioned various properties of the obtained material of $Ni_{57}Mn_{14}Co_{16}Ti_{13}$ are measured and the characteristic curves thereof are collected, and the corresponding parameters are computed. The megnetostrain characteristic curve of the material of $Ni_{57}Mn_{14}Co_{16}Ti_{13}$, as shown in FIG. 6, is obtained by using the Physical Property Measurement System (PPMS, Quantum Design. Inc., US), which indicates the strain property of such material under the magnetic field. Table 1 shows the corresponding values of compressive strength, deformation rate, toughness, magnetic field driving efficiency (dT/dH), magnetostrain (λ), magnetoresistance (MR) and magnetic entropy change (ΔS) of the material of $Ni_{57}Mn_{14}Co_{16}Ti_{13}$.

The Ninth Embodiment

A magnetic phase-transformation material of $Ni_{35}Mn_{36.5}Co_{10.5}Ti_{18}$ with high toughness is prepared in this embodiment by the same method as that of the third embodiment except that heat treatment of Step 5 is omitted.

The aforementioned various properties of the obtained material of $Ni_{35}Mn_{36.5}Co_{10.5}Ti_{18}$ are measured and the characteristic curves thereof are collected, and the corresponding parameters are computed. Table 1 shows the values of compressive strength, deformation rate, toughness, magnetic field driving efficiency (dT/dH), magnetostrain (λ), magnetoresistance (MR) and magnetic entropy change (ΔS) of the material of $Ni_{35}Mn_{36.5}Co_{10.5}Ti_{18}$.

The Tenth Embodiment

A magnetic phase-transformation material of $Ni_{28}Mn_{37}Co_{12}Ti_{23}$ with high toughness is prepared in this embodiment, and the preparation method is as follows:

Step 1: weighing 1000 g in total for materials of Ni, Co, Mn, Ti with purity of 99% in accordance with the formula $Ni_{28}Mn_{37}Co_{12}Ti_{23}$;

Step 2: inputting the weighed materials into a graphite crucible, raising the temperature to 1350° C. in a vacuum of $5\times10^{-3}$ Pa for melting, and maintaining for 20 min;

Step 3: effusing the melted materials obtained in Step 2 from the edge of the graphite crucible to the outer surface of a copper wheel which rotate at a linear speed of 50 m/s, and then solidifying quickly to form a sheet with a thickness of 3 mm;

Step 4: annealing the prepared sheet for 100 hours at 800° C., then cooling at a cooling rate of 5000° C./s to make the obtained material of $Ni_{28}Mn_{37}Co_{12}Ti_{23}$ have higher component homogeneity and atomic ordering.

Figure 7:
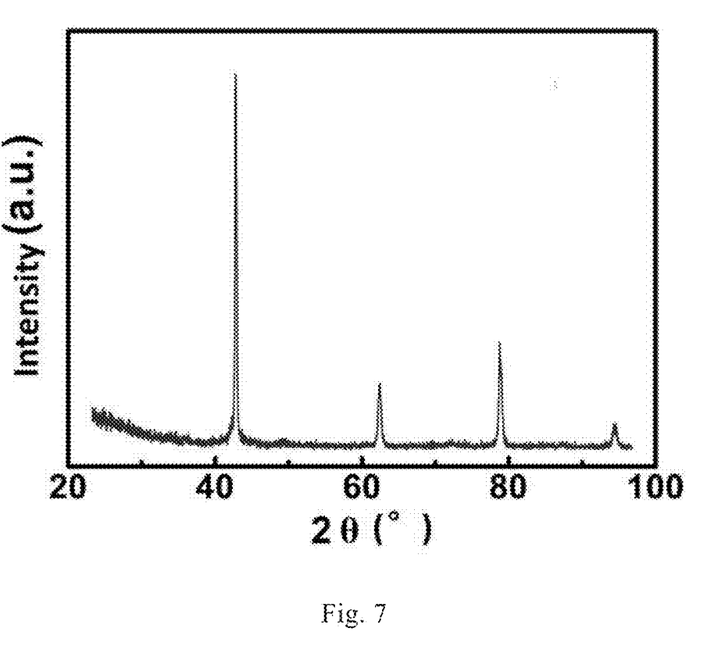
FIG. 7 shows the powder XRD spectrum of a material of $Ni_{28}Mn_{37}Co_{12}Ti_{23}$ in the parent phase according to the tenth embodiment of the present invention.

The aforementioned various properties of the obtained material of $Ni_{28}Mn_{37}Co_{12}Ti_{23}$ are measured and the characteristic curves thereof are collected, and the corresponding parameters are computed. The powder XRD spectrum of the material of $Ni_{28}Mn_{37}Co_{12}Ti_{23}$ in the parent phase, as shown in FIG. 7, is obtained by the conventional X-ray diffractometer at the normal temperature and under the normal pressure, which indicates the basic crystal structure of such material is body-centered cubic structure. Table 1 shows the values of compressive strength, deformation rate, toughness, magnetic field driving efficiency (dT/dH), magnetostrain ($\lambda$), magnetoresistance (MR) and magnetic entropy change ($\Delta S$) of the material of $Ni_{28}Mn_{37}Co_{12}Ti_{23}$.

The Eleventh Embodiment

A magnetic phase-transformation material of $Ni_{53}Mn_{16}Co_{14}Ti_{17}$ with high toughness is prepared in this embodiment, and the preparation method comprises:

Step 1: weighing 500 g in total for materials of Ni, Co, Mn, Ti with purity of 95% in accordance with the formula;

Step 2: inputting the weighed materials into the quartz crucible, and raising the temperature to 1350° C. in the atmosphere and under the normal pressure for melting and maintaining for 20 min;

Step 3: effusing the melted materials into a foundry casting mould and solidifying to a raw material ingot;

Step 4: rolling the raw material ingot down into a profile with a width of 5 mm and a height of 5 mm, wherein the length of the profile is not limited.

The aforementioned various properties of the obtained material of $Ni_{53}Mn_{16}Co_{14}Ti_{17}$ are measured and the characteristic curves thereof are collected, and the corresponding parameters are computed. Table 1 shows the corresponding values of compressive strength, deformation rate, toughness, magnetic field driving efficiency (dT/dH), magnetostrain ($\lambda$), magnetoresistance (MR) and magnetic entropy change ($\Delta S$) of the material of $Ni_{53}Mn_{16}Co_{14}Ti_{17}$.

Comparative Example

Various properties of a Heusler magnetic phase-transformation material of $Ni_2MnGa$ are shown as the Comparative Example in Table 1. $Ni_2MnGa$ alloy is an important and well known magnetic phase-transformation material at present, which is prepared with the similar method to that of the first embodiment according to the formula of $Ni_2MnGa$, and its stress-strain curve (see FIG. 3) is measured to show compressive strength, deformation rate and toughness of the material of $Ni_2MnGa$, the three of which are important parameters representing strength and toughness. As can be seen from FIG. 3, the compressive strength of the present invention sample $Ni_{36.5}Mn_{35}Co_{13.5}Ti_{15}$ is 1150 MPa, while the compressive strength of the $Ni_2MnGa$ is 300 MPa and the deformation rate and the toughness thereof both are zero. Other property parameters of $Ni_2MnGa$, such as isothermal magnetization curve, resistance-magnetic field curve, magnetization-temperature relation curve, magnetocaloric effect curve and megnetostrain characteristic curve, are found from the currently available published literatures, for example, "Large magnetic entropy change in a Heusler alloy $Ni_{52.6}Mn_{23.1}Ga_{24.3}$ single crystal", Feng-xia Hu, Bao-gen Shen, Ji-rong Sun, and Guang-heng Wu et al., published in Phys. Rev. B., Vol. 64, Page 132412, and the best parameters are selected therefrom and shown in table 1 in order to compare with those of the present invention materials. It can be seen from table 1 that the compressive strength, the deformation rate and the toughness of the present materials are much higher than those of the material of $Ni_2MnGa$.

According to other embodiments of the present invention, the purities of Ni, Co, Mn, Ti composing the magnetic phase-transformation materials of $Ni_{a-m}Mn_{b-n}Co_{m+n}Ti_c$ are between 90~99.9999%.

According to other embodiments of the present invention, the magnetic phase-transformation materials of $Ni_{a-m}Mn_{b-n}Co_{m+n}Ti_c$ may be heated to be melted through arc heating, conventional Muffle furnace heating or the other heating methods well known in the art.

According to still further embodiments of the present invention, the crucible for holding the raw materials of the magnetic phase-transformation materials of $Ni_{a-m}Mn_{b-n}Co_{m+n}Ti_c$ may be water-cooled copper crucible or other crucibles well known in the art.

According to other embodiments of the present invention, the temperature for heating the raw materials of the magnetic phase-transformation materials of $Ni_{a-m}Mn_{b-n}Co_{m+n}Ti_c$ and melting them may be between 1280° C.~1400° C., the atmosphere for melting may be a vacuum of $1\times10^{-2}$~$5\times10^{-5}$ Pa, or a shielding gas of 0.01~0.2 MPa such as Ar, $N_2$, or common atmosphere, and the duration maintained in the melted state may be 0.1~60 minutes.

According to still another embodiment of the present invention, the magnetic phase-transformation materials of $Ni_{a-m}Mn_{b-n}Co_{m+n}Ti_c$ prepared with the Czochralski method, may grow at a growing speed of 3~80 mm/h; the seed crystal rod rotates at a rotation speed of 0.5~50 rounds/min; the used seed crystal may be single crystals or polycrystalline having same or similar components and required orientation; and the obtained bulk of materials of $Ni_{a-m}Mn_{b-n}Co_{m+n}Ti_c$ may be single crystals or polycrystalline rods.

According to still further another embodiment of the present invention, the magnetic phase-transformation materials of $Ni_{a-m}Mn_{b-n}Co_{m+n}Ti_c$ prepared with the conventional zone melting method, may grow at a growing speed of 3~80 mm/h; the used seed crystal may be single crystals or polycrystalline having same or similar components and required orientation; or need no seed crystal. The obtained bulk of materials of $Ni_{a-m}Mn_{b-n}Co_{m+n}Ti_c$ may be single crystals or polycrystalline rods.

According to still further another embodiment of the present invention, the method of solidifying various melted magnetic materials of $Ni_{a-m}Mn_{b-n}Co_{m+n}Ti_c$ may be performed as follows: cooling at a determined cooling rate, or pouring into a mould, or pouring onto the surface of a metal having good thermal conductivity, or pouring into various liquids. The above methods can realize slow cooling or rapid cooling, thereby obtaining various shapes of the materials of $Ni_{a-m}Mn_{b-n}Co_{m+n}Ti_c$, including bulk, thin strip, sheet or filament, and so on.

According to another embodiment of the present invention, the temperature for the heating treatment to the materials of $Ni_{a-m}Mn_{b-n}Co_{m+n}Ti_c$ may be at 200° C.~1200° C. and the time may be 0.011000 hours, so that the obtained materials of $Ni_{a-m}Mn_{b-n}Co_{m+n}Ti_c$ can have higher component homogeneity and atomic ordering.

According to still another embodiment of the present invention, the obtained materials of $Ni_{a-m}Mn_{b-n}Co_{m+n}Ti_c$ may be rolled down at a rolling temperature between −130° C.~900° C. While the present invention has been described with reference to the preferred embodiments, it is recognized that the present invention is not limited to the embodiments described above, but includes various changes and modifications made without departing from the scope of the present invention.

TABLE 1

| Compositions | Compressive strength (MPa) | Deformation rate (%) | Toughness (MPa · %) | dT/dH (K/T) | λ (%) | MR (%) | ΔS (J/kgK) |
|---|---|---|---|---|---|---|---|
| The first embodiment $Ni_{40}Mn_{30}Co_{14}Ti_{16}$ | 1100 | 18 | 12050 | 8.2 | 4.1 | 45 | 12 |
| The second embodiment $Ni_{44}Mn_{33}Co_{15}Ti_8$ | 960 | 26 | 13610 | 3.7 | 6.0 | 57 | 22 |
| The third embodiment $Ni_{51}Mn_{13}Co_{10}Ti_{26}$ | 1300 | 15 | 14650 | 3.8 | 6.2 | 46 | 21 |
| The fourth embodiment $Ni_{45}Mn_{31}Co_5Ti_{19}$ | 840 | 12 | 10560 | 4 | 5.5 | 32 | 17 |
| The Fifth embodiment $Ni_{49.5}Mn_{24}Co_{15.5}Ti_{11}$ | 1300 | 30 | 27630 | 8.4 | 4 | 35 | 11 |
| The sixth embodiment $Ni_{36.5}Mn_{35}Co_{13.5}Ti_{15}$ | 1150 | 20 | 12320 | 2.8 | 3.8 | 37 | 14 |
| The seventh embodiment $Ni_{35}Mn_{35}Co_{15}Ti_{15}$ | 1200 | 9 | 8540 | 4.8 | 3.5 | 44.5 | 18 |
| The eighth embodiment $Ni_{57}Mn_{14}Co_{16}Ti_{13}$ | 980 | 35 | 15560 | 5.8 | 4.8 | 28 | 15 |
| The ninth embodiment $Ni_{35}Mn_{36.5}Co_{10.5}Ti_{18}$ | 1500 | 7 | 10540 | 4.9 | 3.0 | 50 | 15.5 |
| The ninth embodiment $Ni_{28}Mn_{37}Co_{12}Ti_{23}$ | 900 | 10 | 6350 | 3.3 | 5.1 | 20 | 20 |
| The eleventh embodiment $Ni_{53}Mn_{16}Co_{14}Ti_{17}$ | 1380 | 12 | 13350 | 7.5 | 4.2 | 31 | 12 |
| Comparative Example $Ni_2MnGa$ | 300 | 4 | 0 | — | — | — | 18 |

The invention claimed is:

1. A magnetic phase-transformation material with the formula: $Ni_{a-m}Mn_{b-n}Co_{m+n}Ti_c$, wherein a+b+c=100, 20<a≤90, 5≤b<50, 5≤c≤30, 0≤m≤a, 0≤n≤b, 0<m+n<a+b, and wherein, any one or combination of a, b, c, m, n represent an atomic percentage content.

2. The magnetic phase-transformation material of claim 1, wherein 28≤a−m≤57.

3. The magnetic phase-transformation material of claim 1, wherein 13≤b−n≤37.

4. The magnetic phase-transformation material of claim 1, wherein 5≤m+n≤16.

5. The magnetic phase-transformation material of claim 1, wherein 8≤c≤26.

6. The magnetic phase-transformation material of claim 1, wherein the formula is $Ni_{40}Mn_{30}Co_{14}Ti_{16}$.

7. The magnetic phase-transformation material of claim 1, wherein the formula is $Ni_{36.5}Mn_{35}Co_{13.5}Ti_{15}$.

8. The magnetic phase-transformation material of claim 1, wherein the formula is $Ni_{35}Mn_{35}Co_{15}Ti_{15}$.

9. The magnetic phase-transformation material of claim 1, wherein the formula is $Ni_{57}Mn_{14}Co_{16}Ti_{13}$.

10. The magnetic phase-transformation material of claim 1, wherein the formula is $Ni_{28}Mn_{37}Co_{12}Ti_{23}$.

11. A method of preparing a magnetic phase-transformation material with the formula: $Ni_{a-m}Mn_{b-n}Co_{m+n}Ti_c$, wherein a+b+c=100, 20<a≤90, 5≤b<50, 5≤c≤30, 0≤m≤a, 0≤n≤b, 0<m+n<a+b, and wherein, any one or combination of a, b, c, m, n represent an atomic percentage content comprising:
    weighing materials of Ni, Co, Mn, Ti in accordance with the formula; and
    preparing the magnetic phase-transformation material from the weighed materials by a Czochralski method or zone melting method or directional solidification method.

12. The method of claim 11, wherein 28≤a−m≤57.

13. The method of claim 11, wherein 13≤b−n≤37.

14. The method of claim 11, wherein 5≤m+n≤16.

15. The method of claim 11, wherein 8≤c≤26.

16. The method of claim 11, wherein the magnetic phase-transformation material is prepared by a Czochralski method.

17. The method of claim 11, wherein the magnetic phase-transformation material is prepared by a zone melting method.

18. The method of claim 11, wherein the magnetic phase-transformation material is prepared by a directional solidification method.

19. The method of claim 11, wherein the formula is $Ni_{40}Mn_{30}Co_{14}Ti_{16}$, $Ni_{36.5}Mn_{35}Co_{13.5}Ti_{15}$, $Ni_{35}Mn_{35}Co_{15}Ti_{15.9}$, $Ni_{57}Mn_{14}Co_{16}Ti_{13}$, or $Ni_{28}Mn_{37}Co_{12}Ti_{23}$.

* * * * *